United States Patent
Cai et al.

(10) Patent No.: US 9,443,884 B2
(45) Date of Patent: Sep. 13, 2016

(54) METHOD FOR MANUFACTURING ESD DEVICE, ESD DEVICE AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhenfei Cai, Beijing (CN); Zhaohui Hao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 25 days.

(21) Appl. No.: 14/368,913

(22) PCT Filed: Sep. 25, 2013

(86) PCT No.: PCT/CN2013/084186
§ 371 (c)(1),
(2) Date: Jun. 26, 2014

(87) PCT Pub. No.: WO2015/000226
PCT Pub. Date: Jan. 8, 2015

(65) Prior Publication Data
US 2015/0303223 A1    Oct. 22, 2015

(30) Foreign Application Priority Data
Jul. 5, 2013  (CN) ........................ 2013 1 0281912

(51) Int. Cl.
*H01L 27/12*  (2006.01)
*H01L 23/60*  (2006.01)

(52) U.S. Cl.
CPC ........... *H01L 27/1244* (2013.01); *H01L 23/60* (2013.01); *H01L 27/1259* (2013.01); *H01L 2924/0002* (2013.01)

(58) Field of Classification Search
CPC . H01L 27/1244; H01L 23/60; H01L 27/124; H01L 27/0248; H01L 27/1259
See application file for complete search history.

(56) References Cited

U.S. PATENT DOCUMENTS 5,929,948 A * 7/1999 Ohori ................ G02F 1/136209
                                                      349/110
6,124,604 A * 9/2000 Koyama ............. G02F 1/13454
                                                       257/59

(Continued)

FOREIGN PATENT DOCUMENTS

| CN | 1617351 A | 5/2005 |
| CN | 201876644 A | 6/2011 |
| CN | 103035192 A | 4/2013 |

OTHER PUBLICATIONS

Written Opinion of the International Searching Authority dated Mar. 24, 2014; PCT/CN2013/084186.

(Continued)

*Primary Examiner* — Khiem D Nguyen
*Assistant Examiner* — Pauline Vu
(74) *Attorney, Agent, or Firm* — Ladas & Parry LLP (57) ABSTRACT

There is disclosed a method for manufacturing an Electro Static Discharge (ESD) device, an ESD device and a display panel, which are capable of addressing an issue that static-electric charges accumulated on the array substrate damage the unformed ESD device and improving a yield ratio of the array substrate. The method includes forming a TFT, a first lead wire, wherein the first lead wire or the second lead wire comprises at least two separate lead-wire segments; depositing a layer of passivation thin film, and forming via-holes for connecting the at least two separate lead-wire segments on the layer of passivation thin film; depositing a layer of transparent conductive film on the substrate on which the via-holes are formed, wherein the layer of transparent conductive film connects the lead-wire segments by the via-holes.

15 Claims, 3 Drawing Sheets

(56) References Cited

U.S. PATENT DOCUMENTS

| | | | |
|---|---|---|---|
| 7,061,565 B2* | 6/2006 | Kwon | G02F 1/136227 257/59 |
| 2002/0101547 A1* | 8/2002 | Lee | G02F 1/136204 349/40 |
| 2003/0020845 A1 | 1/2003 | Lee et al. | |
| 2004/0222813 A1* | 11/2004 | Kim | G09G 3/006 324/756.05 |
| 2005/0087741 A1 | 4/2005 | Yamazaki | |
| 2006/0046359 A1* | 3/2006 | Noda | G02F 1/1368 438/149 |
| 2006/0088949 A1* | 4/2006 | Smayling | H01L 22/12 438/14 |
| 2008/0061295 A1* | 3/2008 | Wang | H01L 27/1288 257/59 |
| 2008/0068524 A1* | 3/2008 | Kim | G02F 1/136286 349/38 |
| 2008/0117558 A1* | 5/2008 | Shih | G02F 1/136204 361/117 |
| 2009/0194883 A1* | 8/2009 | Qin | G02F 1/136227 257/773 |
| 2010/0084654 A1* | 4/2010 | Yamazaki | H01L 27/0248 257/43 |
| 2010/0238095 A1* | 9/2010 | Zhang | H01L 27/0266 345/82 |
| 2013/0088468 A1 | 4/2013 | Sakakura et al. | |
| 2013/0207113 A1* | 8/2013 | Tsai | H01L 27/1225 257/59 |
| 2013/0270562 A1* | 10/2013 | Yamazaki | H01L 29/786 257/57 |

OTHER PUBLICATIONS

First Chinese Office Action dated Jul. 16, 2015; Appln. No. 201310281912.6.

* cited by examiner

METHOD FOR MANUFACTURING ESD DEVICE, ESD DEVICE AND DISPLAY PANEL

TECHNICAL FIELD

The present disclosure relates to a field of display technique, and particularly to a method for manufacturing an Electro Static Discharge (ESD) device, an ESD device and a display panel.

BACKGROUND

In a tablet display apparatus, a Thin Film Transistor Liquid Crystal Display (TFT-LCD) has characteristics such as a small volume, a low power consumption, a relative low manufacturing cost, no radiation and the like, and dominates the market of the present tablet display. An Organic Light-Emitting Diode (OLED) display adopts a display mode different from a conventional LCD display mode, and requires no backlight source. Instead, the OLED display employs a very thin organic material coat and a glass substrate, and when a current flows, the organic material would emit light, and thus the OLED display has characteristics such as a lighter weight, a thinner thickness, an energy-saving and the like.

During a procedure for manufacturing the tablet display apparatus, it often occurs a phenomenon of static-electric breakdown. The static-electric breakdown can lead to a malfunction of a pixel circuit on an array substrate in a display apparatus, and serious static-electric breakdown can result in a short-circuit of the pixel circuit on the array substrate, and in turn the array substrate can not operate properly. Therefore, it needs to configure an anti-static-electric device on the array substrate to release the static-electric charges in time in order to prevent the array substrate from being damaged due to the static-electric charges.

In general, the anti-static-electric device is formed by one or more thin film transistors (TFTs), functioning as switches, and lead wires, wherein the different lead wires in the anti-static-electric device serve as input terminals and output terminals for the static-electric charges, and a purpose for releasing the static-electric charges is achieved by leading out the static-electric charges to the output terminals via the TFTs or by attenuating the static-electric charges gradually on the lead wires. However, during the procedure for manufacturing the TFTs and the lead wires of the anti-static-electric device, it is inevitable that the static-electric charges exist; since the ESD device has not been formed yet at this time, it can not perform the function of releasing static-electric charges; therefore, the static-electric charges accumulated on the glass substrate may break down weak portions of the array substrate; as a result, the static-electric charges accumulated may break down the ESD device before the latter is formed, causing the ESD device to be damaged and to fail to perform the function of releasing static-electric charges.

SUMMARY

Embodiments of the present disclosure provide a method for manufacturing an Electro Static Discharge (ESD) device, an array substrate and a display panel, which are capable of addressing the issue that the static-electric charges accumulated on the array substrate damage the unformed ESD device and improving a yield ratio of the array substrate.

According to an embodiment of the disclosure, there is provided a method for manufacturing an Electro Static Discharge (ESD) device comprising:

in a procedure for manufacturing the ESD device, forming a TFT, a first lead wire connected to a gate and a source of the TFT, and a second lead wire connected to the gate and a drain of the TFT on the substrate by a patterning process, wherein the first lead wire comprises at least two separate lead-wire segments, or the second lead wire comprises at least two separate lead-wire segments; on the substrate on which the first lead wire or the second lead wire is formed, depositing a layer of passivation thin film, and forming via-holes for connecting the at least two separate lead-wire segments of the first lead wire or forming via-holes for connecting the at least two separate lead-wire segments of the second lead wire on the layer of passivation thin film by the patterning process; depositing a layer of transparent conductive film on the substrate on which the via-holes are formed, wherein the layer of transparent conductive film connects the at least two separate lead-wire segments of the first lead wire with each other or connects the at least two separate lead-wire segments of the second lead wire with each other by the via-holes.

As an example, during the procedure for manufacturing the ESD device, by the patterning process, a gate, an active layer, a source and a drain, the first lead wire connected to the gate and the source, and the second lead wire connected to the gate and the drain are sequentially formed on the substrate; wherein the first lead wire comprises at least two separate lead-wire segments, or the second lead wire comprises at least two separate lead-wire segments; on the substrate on which the first lead wire or the second lead wire is formed, depositing a layer of passivation thin film, and etching via-holes for connecting the at least two separate lead-wire segments of the first lead wire or via-holes for connecting the at least two separate lead-wire segments of the second lead wire on the layer of passivation thin film by the patterning process; depositing a layer of transparent conductive film on the substrate on which the via-holes are formed, wherein the layer of transparent conductive film connects the at least two separate lead-wire segments of the first lead wire with each other or connects the at least two separate lead-wire segments of the second lead wire with each other by the via-holes.

According to an embodiment of the disclosure, there is provided an ESD device manufactured by the above method, wherein the ESD device comprises a Thin Film Transistor TFT formed on a substrate, and wherein a source and a gate of the TFT are connected to a first lead wire, and the gate and a drain of the TFT are connected to a second lead wire; the first lead wire comprises at least two separate lead-wire segments, or the second lead wire comprises at least two separate lead-wire segments; wherein the at least two separate lead-wire segments are connected electrically by a layer of transparent conductive film.

According to an embodiment of the disclosure, there is provided a display panel comprising the ESD device as discussed above.

In the above technical solutions, during the procedure for manufacturing the ESD device, sequentially forming the TFT, the first lead wire connected to the gate and the source of the TFT, and the second lead wire connected to the gate and the drain of the TFT on the substrate by the patterning process, wherein the first lead wire comprises at least two separate lead-wire segments, or the second lead wire comprises at least two separate lead-wire segments; on the substrate on which the first lead wire or the second lead wire is formed, depositing the layer of passivation thin film, and forming the via-holes for connecting the at least two separate lead-wire segments of the first lead wire or forming the via-holes for connecting the at least two separate lead-wire segments of the second lead wire on the layer of passivation thin film by the patterning process; depositing the layer of transparent conductive film on the substrate on which the via-holes are formed, wherein the layer of transparent conductive film connects the at least two separate lead-wire segments of the first lead wire with each other or connects the at least two separate lead-wire segments of the second lead wire with each other by the via-holes. In such a way, before the ESD device is formed, the static-electric charges accumulated on the TFT substrate would not damage the unformed ESD device, and after the layer of transparent conductive film is deposited, the lead-wire segments are connected by the via-holes, and the ESD device can perform a function for releasing static-electric charges; further, a layer of transparent conductive film in the pixel electrodes and the layer of transparent conductive film proposed in the present disclosure can be formed simultaneously in the procedure for manufacturing the TFT substrate, and thus the static-electric charges accumulated on the array substrate would not contact the ESD device before the layers of transparent conductive film are formed; and after the layers of transparent conductive film are formed, the ESD device can perform the function for releasing the static-electric charges, so that it can prevent the unformed ESD device from being damaged by the static-electric charges accumulated on the array substrate, and can improve the yield ratio of the array substrate.

DETAILED DESCRIPTION

Following problems exist in the prior art that the static-electric charges accumulated on the glass substrate may break down the weak portions of the array substrate, and the static-electric charges accumulated may break down the ESD device before the latter is formed, causing the ESD device to be damaged and to fail to perform the function of releasing static-electric charges. In view of this, the embodiments of the disclosure propose a solution that, before the ESD device is formed, lead wires of the ESD device are separate, and finally the separate lead wires are connected electrically by a deposited layer of transparent conductive film after a layer of passivation thin film is deposited. Thus, before the ESD device is formed, the static-electric charges accumulated on the TFT substrate would not damage the unformed ESD device, and after the layer of transparent conductive film is formed, the ESD device can perform the function for releasing static-electric charges; further, the layer of transparent conductive film for connecting lead-wire segments and a layer of transparent conductive film needed in manufacturing the array substrate in the ESD device can be formed simultaneously, and thus it can avoid temporally the damage of the ESD device caused by the static-electric charges damage, and can improve the yield ratio of the array substrate.

Hereinafter, main principles for realizing technical solutions of embodiments of the disclosure, an implementation of the technical solutions thereof and the corresponding beneficial effects which can be achieved are described in detail with reference to respective accompanying figures.

Figure 1:
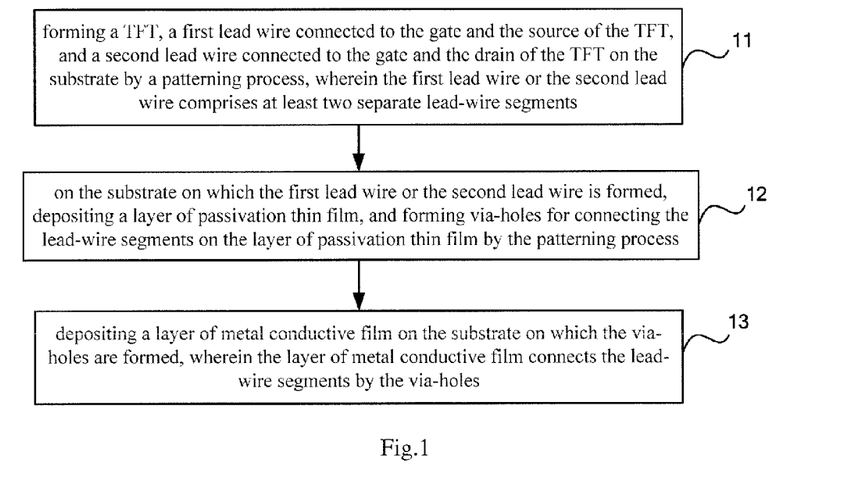
FIG. 1 is a flowchart of a method for manufacturing an array substrate provided in an embodiment of the disclosure.

An embodiment of the disclosure provides a method for manufacturing an array substrate, as shown in FIG. 1, the method comprises flows as follows.

At a step 11, in a procedure for manufacturing an ESD device, a Thin Film Transistor TFT, a first lead wire connected to a gate and a source of the TFT, and a second lead wire connected to the gate and a drain of the TFT are formed on the substrate by a patterning process, wherein the first lead wire comprises at least two separate lead-wire segments, or the second lead wire comprises at least two separate lead-wire segments.

During the procedure for manufacturing the ESD device, when the TFT is formed on the substrate by the patterning process, the gate, a gate isolating layer, an active layer, the source and the drain of the TFT, the first lead wire connected to the gate and the source of the TFT, and the second lead wire connected to the gate and the drain of the TFT are formed sequentially.

Herein, during the procedure for manufacturing the ESD device, when the lead wire is formed, the lead wire can be connected to the gate and the source. Further, the lead wire can be connected to the gate and the drain. For facilitating the illustration, in the embodiments of the present disclosure, the lead wire connected to the gate and the source is referred to as the first lead wire, and the lead wire connected to the gate and the drain is referred to as the second lead wire.

In the procedure for manufacturing the ESD device, the separate lead-wire segments can be formed as follows: after the whole first lead wire or the whole second integral lead wire is formed, the formed whole first integral lead wire or the whole second lead wire is cut off by etching. Alternatively, the separate lead-wire segments can also be formed as below: when the first lead wire or the second lead wire is formed, at least two separate lead-wire segments are formed directly. The separate lead-wire segments can be on a same horizontal line, or can be staggered with a certain angle. Widths of the formed lead-wire segments can be identical or not identical.

Optionally, in a technical solution proposed in an embodiment of the disclosure, the formed lead-wire segments are on the same horizontal line, and the widths of the formed lead-wire segments are identical.

When the first lead wire is formed, the formed first lead wire comprising at least two lead-wire segments and the gate can be formed simultaneously, or the formed first lead wire comprising at least two lead-wire segments and the source can be formed simultaneously. Similarly, for the second lead wire, the formed second lead wire comprising at least two lead-wire segments and the gate can be formed simultaneously, or the formed second lead wire comprising at least two lead-wire segments and the drain can be formed simultaneously. Next, different methods for configurating the first lead wire or the second lead wire will be illustrated in detail respectively.

First Mode

Figure 2:
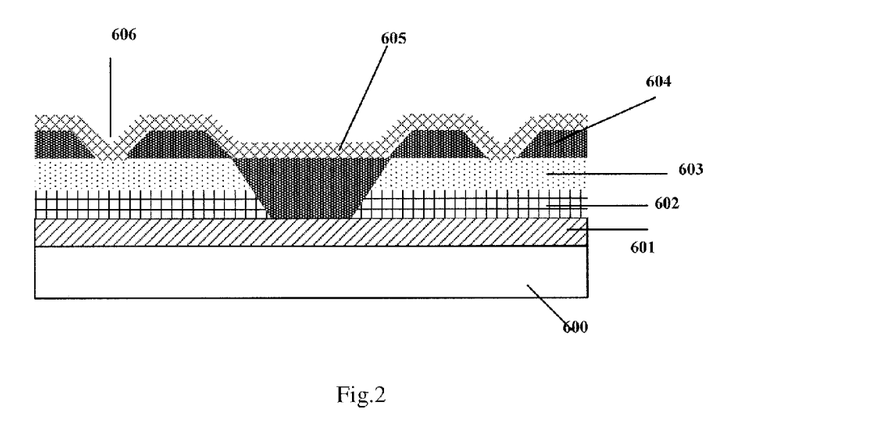
FIG. 2 is a schematic cross-sectional diagram of the array substrate formed by a patterning process provided in an embodiment of the disclosure.

For the first lead wire formed with the gate simultaneously, athe detailed formation procedure is as follows. As shown in FIG. 2, a layer of gate metal thin film is deposited on the substrate 600 to form a gate metal layer 601. The first lead wire and the gate are formed by the patterning process, wherein the first lead wire is connected to the gate. The formed first lead wire comprises at least two separate lead-wire segments. The separate lead-wire segments can be the lead-wire segments formed directly during a masking procedure, or it can be another case where the first lead wire comprising at least two lead-wire segments is formed by breaking the whole first lead wire with the etching process after the whole first lead wire is formed. On the substrate on which the gate metal layer 601 is formed, a gate isolating layer (not shown in FIG. 2), an active layer 602 and a source-drain metal layer 603 are formed by the patterning process in sequence. On the formed source-drain metal layer 603, via-holes are formed by the patterning process, and the source and the gate are connected by the formed via-holes.

Similarly, for the second lead wire formed with the gate simultaneously, a detailed principle for its implementation is the same as that for the first lead wire formed with the gate simultaneously. In particular, as shown in FIG. 2, a layer of gate metal thin film is deposited on the substrate 600 to form a gate metal layer 601. The second lead wire and the gate are formed by the patterning process, wherein the second lead wire is connected to the gate. The formed second lead wire comprises at least two separate lead-wire segments. The separate lead-wire segments can be the lead-wire segments formed directly during the masking procedure, or it can be another case where the second lead wire comprising at least two lead-wire segments is formed by breaking a whole second lead wire with the etching process after the whole second lead wire is formed. On the substrate on which the gate metal layer 601 is formed, a gate isolating layer (not shown in FIG. 2), an active layer 602 and a source-drain metal layer 603 are formed by the patterning process in sequence. On the formed source-drain metal layer 603, via-holes are formed by the patterning process, and the drain and the gate are connected by the formed via-holes.

In particular, a distance between the two lead-wire segments comprised in the first lead wire or the second lead-wire can be 15-30 micrometers. Optionally, the distance between the two lead-wire segments can be 20 micrometers.

Second Mode

For the first lead wire formed with the source simultaneously, a detailed formation procedure is as follows. As shown in FIG. 2, a layer of gate metal thin film is deposited on the substrate 600 to form a gate metal layer 601. After the gate metal layer 601 is formed, the gate is formed by the etching process. On the substrate on which the gate metal layer 601 is formed, a gate isolating layer (not shown in FIG. 2), an active layer 602 and a source-drain metal layer 603 are formed by the patterning process in sequence. Via-holes are formed by the patterning process, and the source and the gate are connected by the formed via-holes. On the formed source-drain metal layer 603, the first lead wire connected to the source is formed simultaneously during the procedure for forming the source and the drain. The formed first lead wire comprises at least two separate lead-wire segments.

The separate lead-wire segments can be the lead-wire segments formed directly during the masking procedure, or it can be another case where the first lead wire comprising at least two lead-wire segments is formed by breaking a whole first lead wire with the etching process after the whole first lead wire is formed.

Similarly, for the second lead wire formed with the drain simultaneously, a detailed principle for its implementation is the same as that for the first lead wire formed with the source simultaneously. In particular, as shown in FIG. 2, a layer of gate metal thin film is deposited on the substrate 600 to form a gate metal layer 601. The gate is formed on the gate metal layer 601 by the etching process. On the substrate on which the gate metal layer 601 is formed, a gate isolating layer (not shown in FIG. 2), an active layer 602 and a source-drain metal layer 603 are formed by the patterning process in sequence. The source and the drain are formed on the source-drain metal layer 603 by the patterning process. Via-holes are formed by the patterning process, and the drain and the gate are connected by the formed via-holes. On the formed source-drain metal layer 603, the second lead wire connected to the drain is formed simultaneously during the procedure for forming the source and the drain. The formed second lead wire comprises at least two separate lead-wire segments. The separate lead-wire segments can be the lead-wire segments formed directly during the masking procedure, or it can be another case where the second lead wire comprising at least two lead-wire segments is formed by breaking a whole second lead wire with the etching process after the whole second lead wire is formed.

In particular, the distance between the two lead-wire segments comprised in the first lead wire or the second lead-wire can be 15-30 micrometers. Optionally, the distance between the two lead-wire segments can be 20 micrometers.

At a step 12, on the substrate on which the first lead wire or the second lead wire is formed, a layer of passivation thin film is deposited, and Via-holes for connecting the lead-wire segments are formed on the layer of passivation thin film by the patterning process.

At a step 13, a layer of transparent conductive film is deposited on the substrate on which the via-holes are formed, wherein the layer of transparent conductive film connects the at least two separate lead-wire segments of the first lead wire with each other by the via-holes, or connects the at least two separate lead-wire segments of the second lead wire with each other by the via-holes.

In particular, a material of the layer of transparent conductive film is the same as that of a layer of pixel electrodes formed when the array substrate is manufactured. On the substrate on which the via-holes are formed, a layer of ITO thin film 605 having the same material as that of the pixel electrode is deposited, and the deposited ITO thin film 605 connects the separate lead-wire segments 604 by the via-holes 606, to form the full first lead wire or the full second lead wire, so that the first lead wire or the second lead wire recovers the conductive function.

Figure 3:
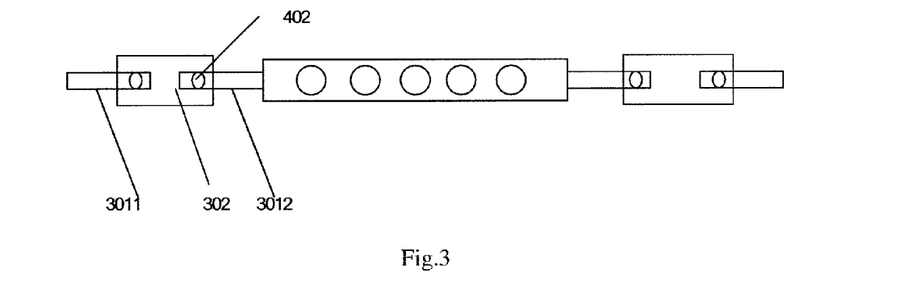
FIG. 3 is a top-view of an ESD device formed according to an embodiment of the disclosure.

FIG. 3 shows a top-view of an ESD device formed on the array substrate containing the ESD device manufactured by the above procedures.

Figure 4:
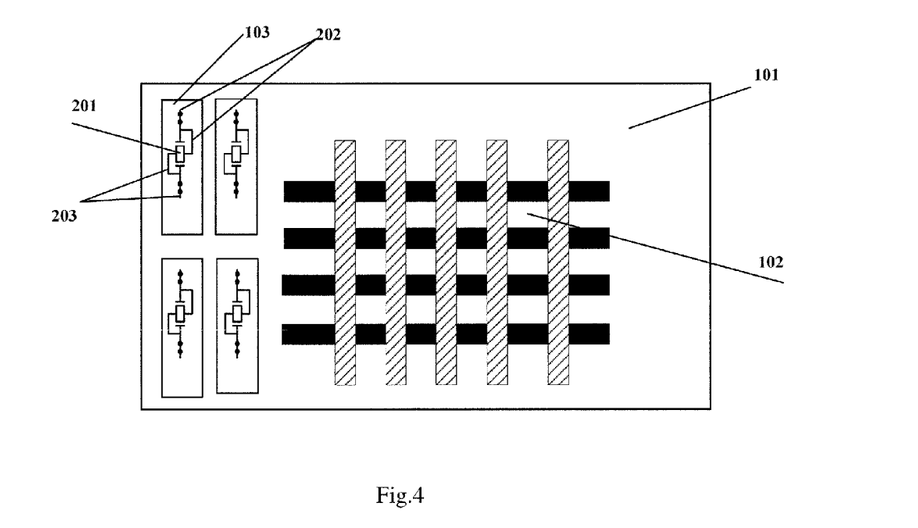
FIG. 4 is a schematic diagram of a structure configuration of the array substrate provided in an embodiment of the disclosure.

FIG. 4 shows a first type of array substrate comprising an ESD device manufactured by the above procedures, wherein it comprises a substrate 11 including a region for a pixel array 102 formed on the substrate 101, and at least one row of ESD devices 103 located on peripheral regions of the pixel array. The ESD device 103 comprises at least one TFT

201. Herein, detailed descriptions will be given taking a bi-directional TFT as an example.

Figure 5:
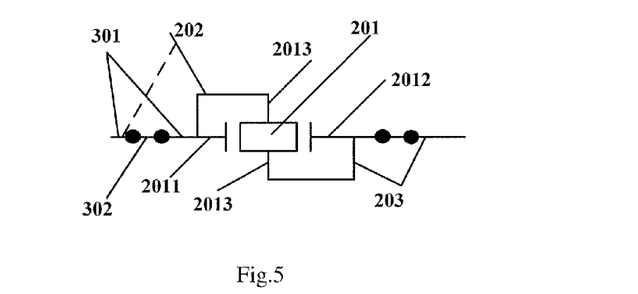
FIG. 5 is a schematic diagram of a structure configuration of the ESD device provided in an embodiment of the disclosure.

In particular, as shown in FIG. 5, a source 2011 and a gate 2013 of the TFT 201 are connected to a first lead wire 202. Herein, the first lead wire 202 comprises two lead-wire segments 301, and the two lead-wire segments 301 are electrically connected to each other by a layer of conductive film 302. Optionally, a layer of metal film forming the first lead wire 202 is a gate metal layer or a source-drain metal layer.

As shown in FIG. 5, the first lead wire 202 connected to the source 2011 and the gate 2013 of the TFT 201, the second lead wire 203 connected to the gate 2013 and the drain 2012 of the TFT 201, form a part of the ESD device. Static-electric charges accumulated on the array substrate are led into via the first lead wire, and in a case in which a current is large, the TFT 201 in the ESD device may be turned on, and the TFT 201 operates to lead out the static-electric charges so as to perform an anti-static-electric effect. If the TFT is applied to a normal operative voltage in order not enable the ESD device to operate, the ESD would not affect the normal display of the TFT substrate.

However, before the ESD device is formed, a large amount of static-electric charges would also accumulate on the array substrate; at this time, since the ESD device has not been formed yet, it can not perform the function of releasing static-electric charges; the large amount of static-electric charges would cause the unformed ESD device to be broken down. In a technical solution proposed in an embodiment of the disclosure, the first lead wire 202 comprises two lead-wire segments. When the ESD device is manufactured, since the first lead wire 202 comprises two separate lead-wire segments, the static-electric charges generated during the procedure for manufacturing the array substrate would not damage the unformed ESD device before the ESD device is formed. Next, detailed descriptions will be given by taking the first lead wire as an example.

Figure 6:
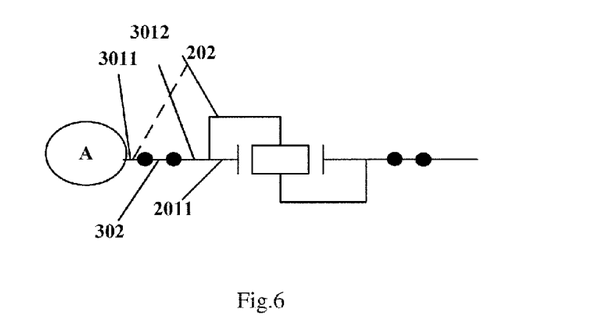
FIG. 6 is a schematic diagram of a structure configuration of a first lead wire in the ESD device provided in an embodiment of the disclosure.

As shown in FIG. 6, a first lead wire 202 comprise two lead-wire segments, i.e., a lead-wire segment 3011 and a lead-wire segment 3012 respectively; before the ESD device is formed, the lead-wire segment 3011 is disconnected from the lead-wire segment 3012. Before the ESD device is formed, when a large amount of static-electric charges accumulate on the array substrate, presuming that when the large amount of static-electric charges accumulate in a region A shown in FIG. 6, such static-electric charges would be imported to the lead-wire segment 3011 of the first lead-wire 202; and since the lead-wire segment 3011 is disconnected from the lead-wire segment 3012 at this time, the static-electric charges can not be imported to the TFT 201, and thus the unformed ESD device can not be damaged; further, since the static-electric charges are transferred on the lead-wire segment 3011, all or a part of the static-electric charges would be consumed by a resistance of the lead-wire segment 3011.

Figure 7:
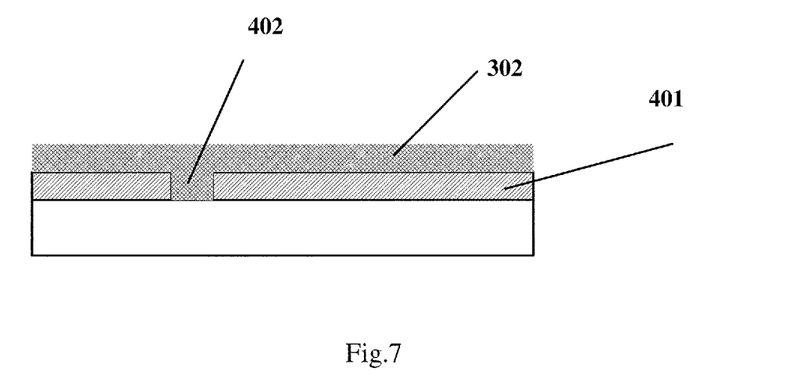
FIG. 7 is a schematic diagram of a structure configuration of a formed TFT provided in an embodiment of the disclosure.

Optionally, as shown in FIG. 7, the TFT 201 comprises a protective layer 401 covering the TFT 201, and a layer of conductive film 302 is located on the protective layer 401, wherein the lead-wire segment 3011 and the lead-wire segment 3012 in FIG. 3 are connected electrically to each other by a via-hole 402, so that the lead-wire segment 3011 and the lead-wire segment 3012 are connected to form a final ESD device.

In particular, a distance between the lead-wire segment 3011 and the lead-wire segment 3012 is 15-30 micrometers.

Optionally, the distance between the lead-wire segment 3011 and the lead-wire segment 3012 can be 20 micrometers.

In an ESD device proposed in the embodiments of the disclosure, the ESD device comprises a plurality of TFTs 201, and respective TFTs 201 can be connected in serial, or can be connected in parallel.

In the procedure for manufacturing the array substrate, since the region of pixel array or a region of common electrodes often contacts a static-electric source, the static-electric charges would accumulate in the region of pixel array or the region of common electrodes; before the pixel electrodes are formed, the ESD device on the array substrate can not perform the function of releasing the static-electric charges; further, when the ESD device is arranged on the array substrate, since the structure of the ESD device per se is relatively compact, the ESD device may be broken down by the static-electric charges accumulated on the array substrate before the ESD device is formed; the device broken down by the static-electric charges can not perform the function of releasing the static-electric charges any more and thus is disabled. During subsequent procedures for manufacturing the array substrate, the static-electric charges generated in the region of pixel array or the region of common electrodes Vcom can not be released, and thus the unreleased static-electric charges would break down the pixels. As compared, the technical solutions proposed in the embodiments of the disclosure can avoid the failure of the ESD device before its formation very well.

FIG. 4 further shows a second type of array substrate comprising an ESD device manufactured by the above procedures, wherein the array substrate comprises a region of a pixel array 102 formed on the substrate 101, and at least one row of ESD devices 103 located on a peripheral regions of the pixel array, wherein the ESD device 103 comprises at least one TFT 201. Herein, detailed descriptions will be given still by taking the bi-directional TFT as an example. In particular, as shown in FIG. 5, a gate 2013 and a drain 2012 of the TFT 201 are connected to a second lead wire 203. Herein, the second lead wire 203 comprises two lead-wire segments 301, and the two lead-wire segments 301 are connected to each other by a layer of conductive film 302 electrically. Optionally, the layer of metal film forming the second lead wire 202 is a gate metal layer or a source-drain metal layer.

As shown in FIG. 5, the second lead wire 203 connected to the gate 2013 and the drain 2012 of the TFT 201 forms a part of the ESD device. The static-electric charges accumulated on the array substrate are led into via the first lead wire or the second lead wire; in a case in which the number of the static-electric charges is large, the TFT 201 in the ESD device would be turned on, and the TFT 201 operates to lead out the static-electric charges so as to perform an anti-static-electric effect. If the amount of the static-electric charges is small, the static-electric charges would be consumed on the first lead wire and the second lead wire, and thus the anti-static-electric effect can also be performed.

However, before the ESD device is formed, a large amount of static-electric charges would accumulate on the array substrate; at this time, since the ESD device has not been formed yet, it can not perform the function of releasing static-electric charges; the large amount of static-electric charges would cause the unformed ESD device to be broken down. In the technical solution proposed in an embodiment of the disclosure, at least one of the second lead wires 203 comprises two lead-wire segments. When the ESD device is manufactured, since the second lead wire 203 comprises two separate lead-wire segments, the static-electric charges generated during the procedure for manufacturing the array substrate would not damage the unformed ESD device before the ESD device is formed.

In particular, the distance between one lead-wire segment and another lead-wire segment is 15-30 micrometers.

Optionally, the distance between one lead-wire segment and another lead-wire segment can be 20 micrometers.

In the array substrate proposed in the embodiments of the disclosure, the ESD device comprises a plurality of TFTs 201. In the technical solution proposed in the first embodiment of the disclosure, the respective TFTs 201 can be connected in serial, or can be connected in parallel.

Accordingly, an embodiment of the disclosure further proposes a display panel comprising the ESD device as discussed above.

In the technical solutions provided in the embodiments of the disclosure, before the ESD device is formed, the static-electric charges accumulated on the TFT substrate can not damage the unformed ESD device, and after the layer of transparent conductive film is formed, the ESD device can perform the function of releasing static-electric charges; further, the layer of transparent conductive film of the pixel electrodes and the layer of transparent conductive film proposed in the disclosure can be formed simultaneously in the procedure for manufacturing the TFT substrate, and thus the static-electric charges accumulated on the array substrate can not contact the ESD device before the layer of transparent conductive film is formed; and after the layer of transparent conductive film is formed, the ESD device can perform the function of releasing the static-electric charges, so that it can prevent the unformed ESD device from being damaged by the static-electric charges accumulated on the array substrate and improve the yield ratio of the array substrate.

Although the embodiments of the disclosure have been described as above, those skilled in the art can make variations and modifications to those embodiments once they obtain the basic inventive concept of the disclosure. Thus, the attached claims are intended to be explained to cover the above embodiments and all the variations and modifications which fall into the scope of the disclosure.

Obviously, those skilled in the art can make various modifications and variations to the embodiments of the disclosure without departing from the spirit and the scope of the present disclosure, and all such modifications and variations are intended to be included within the scope of the disclosure provided that such modifications and variations belong to the scope of the claims and the equivalence thereof.

What is claimed is:

1. A method for manufacturing an Electro Static Discharge (ESD) device comprising:
   in a procedure for manufacturing the ESD device, forming a thin film transistor (TFT), a first lead wire connected to a gate and a source of the TFT, and a second lead wire connected to the gate and a drain of the TFT on a substrate by a patterning process, wherein the first lead wire comprises at least two separate lead-wire segments, or the second lead wire comprises at least two separate lead-wire segments;
   on the substrate on which the first lead wire or the second lead wire is formed, depositing a layer of passivation thin film, and forming via-holes for connecting the at least two separate lead-wire segments of the first lead wire or forming via-holes for connecting the at least two separate lead-wire segments of the second lead wire on the layer of passivation thin film by the patterning process; and
   depositing a layer of transparent conductive film on the substrate on which the via-holes are formed, wherein the layer of transparent conductive film connects the at least two separate lead-wire segments of the first lead wire with each other or connects the at least two separate lead-wire segments of the second lead wire by the via-holes,
   wherein the formed second lead wire, comprising the at least two separate lead-wire segments, and the are formed simultaneously; or
   the formed second lead wire, comprising the at least two separate lead-wire segments, the source and the drain are formed simultaneously.

2. The method of claim 1, wherein
   the formed first lead wire, comprising the at least two separate lead-wire segments, and the gate are formed simultaneously; or
   the formed first lead wire, comprising the at least two separate lead-wire segments, the source and the drain are formed simultaneously.

3. The method of claim 1, wherein
   a material of the layer of transparent conductive film and that of a layer of pixel electrodes formed when manufacturing an array substrate are identical.

4. The method of claim 1, wherein a distance between two adjacent separate lead-wire segments among the at least two separate lead-wire segments is 15-30 micrometers.

5. The method of claim 4, wherein the distance between the two adjacent separate lead-wire segments is 20 micrometers.

6. An Electra Static Discharge (ESD) device, comprising a thin film transistor (TFT) formed on a substrate, wherein
   a source and a gate of the TFT are connected to a first lead wire, and the gate and a drain of the TFT are connected to a second lead wire; the first lead wire comprises at least two separate lead-wire segments, or the second lead wire comprises at least two separate lead-wire segments;
   wherein the at least two separate lead-wire segments are connected electrically by a layer of transparent conductive film,
   wherein the ESD device is manufactured by a method comprising:
   in a procedure for manufacturing the ESD device, forming the thin film transistor (TFT), the first lead wire connected to the gate and the source of the TFT, and the second lead wire connected to the gate and the drain of the TFT on the substrate by a patterning process;
   on the substrate on which the first lead wire or the second lead wire is formed, depositing a layer of passivation thin film, and forming via-holes for connecting the at least two separate lead-wire segments of the first lead wire or forming via-holes for connecting the at least two separate lead-wire segments of the second lead wire on the layer of passivation thin film by the patterning process; and
   depositing the layer of transparent conductive film on the substrate on which the via-holes are formed, wherein the layer of transparent conductive film connects the at least two separate lead-wire segments of the first lead wire with each other or connects the at least two separate lead-wire segments of the second lead wire by the via-holes, wherein the formed second lead wire, comprising the at least two separate lead-wire segments, and the gate are formed simultaneously; or the formed second lead wire, comprising the at least two separate lead-wire segments, the source and the drain are formed simultaneously.

7. The ESD device of claim 6, wherein the formed first lead wire, comprising the at least two separate lead-wire segments, and the gate are formed simultaneously; or the formed first lead wire, comprising the at least two separate lead-wire segments, the source and the drain are formed simultaneously.

8. The ESD device of claim 6, wherein a material of the layer of transparent conductive film and that of a layer of pixel electrodes formed when manufacturing an array substrate are identical.

9. The ESD device of claim 6, wherein a distance between two adjacent separate lead-wire segments among the at least two separate lead-wire segments is 15-30 micrometers.

10. The ESD device of claim 9, wherein the distance between the two adjacent separate lead-wire segments is 20 micrometers.

11. A display panel comprising an Electro Static Discharge (ESD) device, the ESD device comprising a thin film transistor (TFT) formed on a substrate, wherein a source and a gate of the TFT are connected to a first lead wire, and the gate and a drain of the TFT are connected to a second lead wire; the first lead wire comprises at least two separate lead-wire segments, or the second lead wire comprises at least two separate lead-wire segments;

wherein the at least two separate lead-wire segments are connected electrically by a layer of transparent conductive film, wherein the ESD device is manufactured by a method comprising:

in a procedure for manufacturing the ESD device, forming the thin film transistor (TFT), the first lead wire connected to the gate and the source of the TFT, and the second lead wire connected to the gate and the drain of the TFT on the substrate by a patterning process;

on the substrate on which the first lead wire or the second lead wire is formed, depositing a layer of passivation thin film, and forming via-holes for connecting the at least two separate lead-wire segments of the first lead wire or forming via-holes for connecting the at least two separate lead-wire segments of the second lead wire on the layer of passivation thin film by the patterning process; and depositing the layer of transparent conductive film on the substrate on which the via-holes are formed, wherein the layer of transparent conductive film connects the at least two separate lead-wire segments of the first lead wire with each other or connects the at least two separate lead-wire segments of the second lead wire by the via-holes, wherein the formed second lead wire, comprising the at least two separate lead-wire segments, and the gate are formed simultaneously; or the formed second lead wire, comprising the at least two separate lead-wire segments, the source and the drain are formed simultaneously.

12. The display panel of claim 11, wherein the formed first lead wire, comprising the at least two separate lead-wire segments, and the gate are formed simultaneously; or the formed first lead wire, comprising the at least two separate lead-wire segments, the source and the drain are formed simultaneously.

13. The display panel of claim 11, wherein a material of the layer of transparent conductive film and that of a layer of pixel electrodes formed when manufacturing an array substrate are identical.

14. The display panel of claim 11, wherein a distance between two adjacent separate lead-wire segments among the at least two separate lead-wire segments is 15-30 micrometers.

15. The display panel of claim 14, wherein the distance between the two adjacent separate lead-wire segments is 20 micrometers.

* * * * *